United States Patent
Nakamura et al.

(10) Patent No.: US 11,296,048 B2
(45) Date of Patent: Apr. 5, 2022

(54) SEMICONDUCTOR CHIP MOUNTING DEVICE AND METHOD FOR MANUFACTURING SEMICONDUCTOR DEVICE

(71) Applicant: SHINKAWA LTD., Tokyo (JP)

(72) Inventors: Tomonori Nakamura, Tokyo (JP); Toru Maeda, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 244 days.

(21) Appl. No.: 16/338,700

(22) PCT Filed: Sep. 29, 2017

(86) PCT No.: PCT/JP2017/035419
§ 371 (c)(1),
(2) Date: Nov. 1, 2019

(87) PCT Pub. No.: WO2018/066462
PCT Pub. Date: Apr. 12, 2018

(65) Prior Publication Data
US 2021/0257329 A1 Aug. 19, 2021

(30) Foreign Application Priority Data

Oct. 6, 2016 (JP) .............................. JP2016-198434

(51) Int. Cl.
*H01L 23/00* (2006.01)
*H01L 25/065* (2006.01)
*H01L 25/00* (2006.01)

(52) U.S. Cl.
CPC .......... *H01L 24/75* (2013.01); *H01L 25/0652* (2013.01); *H01L 25/50* (2013.01);
(Continued)

(58) Field of Classification Search
CPC ................. H01L 25/0652; H01L 25/50; H01L 2224/73253; H01L 2225/06517;
(Continued)

(56) References Cited

U.S. PATENT DOCUMENTS

2018/0096980 A1* 4/2018 Asahi ................ H01L 21/67144

FOREIGN PATENT DOCUMENTS

| JP | 2009130293 | 6/2009 |
| JP | 2014060241 | 4/2014 |
| JP | 2016162920 | 9/2016 |

OTHER PUBLICATIONS

"International Search Report (Form PCT/ISA/210) of PCT/JP2017/035419," dated Dec. 26, 2017, with English translation thereof, pp. 1-2.

\* cited by examiner

*Primary Examiner* — Jasmine J Clark
(74) *Attorney, Agent, or Firm* — JCIPRNET

(57) ABSTRACT

Provided is a mounting device in which two or more semiconductor chips are laminated and mounted at a plurality of locations on a substrate, said mounting device including: a stage that supports the substrate; a bonding part that laminates and mounts the plurality of semiconductor chips on the substrate while heating the plurality of semiconductor chips and the substrate; and a heat insulating member that is interposed between the stage and the substrate, said heat insulating member including a first layer which is in contact with the substrate and to which heat is applied from the bonding part via the semiconductor chips and the substrate, and a second layer which is disposed closer to the stage side than the first layer, wherein the first layer has a larger heat resistance than the second layer.

6 Claims, 7 Drawing Sheets

(52) U.S. Cl.
CPC ............... *H01L 2224/75252* (2013.01); *H01L 2224/75253* (2013.01); *H01L 2225/06513* (2013.01); *H01L 2225/06517* (2013.01); *H01L 2225/06565* (2013.01)

(58) Field of Classification Search
CPC ........... H01L 2224/75252; H01L 24/75; H01L 2225/06565; H01L 2225/06513; H01L 2224/75253; H01L 24/13; H01L 25/0657; H01L 2224/131; H01L 2224/16145; H01L 2224/32145; H01L 2224/81203
See application file for complete search history.

SEMICONDUCTOR CHIP MOUNTING DEVICE AND METHOD FOR MANUFACTURING SEMICONDUCTOR DEVICE

CROSS-REFERENCE TO RELATED APPLICATION

This application is a 371 application of the International PCT application serial no. PCT/JP2017/035419, filed on Sep. 29, 2017, which claims the priority benefit of Japan Patent Application No. 2016-198434, filed on Oct. 6, 2016. The entirety of each of the abovementioned patent applications is hereby incorporated by reference herein and made a part of this specification.

TECHNICAL FIELD

The present invention relates to a mounting device for laminating and mounting two or more semiconductor chips in a plurality of locations on a substrate, and a manufacturing method for manufacturing a semiconductor device.

BACKGROUND ART

In the related art, there is demand for higher functionality and miniaturization in semiconductor devices. In some cases, a method of laminating and mounting a plurality of semiconductor chips has been proposed. Generally, a bump and a non-conductive film (which will hereinafter be referred to as "an NCF") covering the bump are provided on one surface of a semiconductor chip. The NCF includes a thermosetting resin, which is reversibly softened in accordance with a temperature rise to a temperature lower than a predetermined curing start temperature but is irreversibly cured in accordance with a temperature rise if the temperature exceeds the curing start temperature. In order to laminate and mount these semiconductor chips, a method of forming a temporary laminate by laminating a plurality of semiconductor chips while performing temporary crimping, and performing permanent crimping by heating and crimping this temporary laminate thereafter has been proposed. Hereinafter, a laminate after being subjected to permanent crimping will be referred to as "a chip laminate", thereby being distinguished from a temporary laminate subjected to only temporary crimping. In temporary crimping, semiconductor chips are heated and crimped at a temperature at which NCFs are softened. In addition, in permanent crimping, a temporary laminate is heated and crimped at a temperature at which bumps in all of the plurality of semiconductor chips constituting the temporary laminate melt and the NCFs are cured.

For example, Patent Literature 1 discloses such a laminating technology. In Patent Literature 1, a thermosetting adhesive film is laminated on a surface of a semiconductor chip on which bumps have been formed in advance. During lamination and mounting, first, a multistage temporarily crimped laminate body (temporary laminate) is formed by sequentially laminating a plurality of semiconductor chips on a substrate or another semiconductor chip while performing temporary crimping. Next, a permanent crimping step of melting the bumps and curing the thermosetting adhesive films is executed by crimping and heating this multistage temporarily crimped laminate body from above. According to such a technology, more semiconductor chips can be mounted in a smaller area. Therefore, higher functionality and miniaturization can be achieved.

CITATION LIST

Patent Literature

[Patent Literature 1]
Japanese Unexamined Patent Application Publication No. 2014-60241

SUMMARY OF INVENTION

Technical Problem

Here, as a matter of course, in order to realize higher functionality and miniaturization, the number of lamination layers (which will hereinafter be referred to as "a target number of layers") of semiconductor chips may be increased. However, in a case of a technology of collectively performing permanent crimping of a plurality of semiconductor chips constituting a temporary laminate by heating and crimping an upper surface of the temporary laminate, if the target number of layers increases, a temperature difference dT between an upper layer and a lower layer is increased in accordance therewith. This temperature difference dT may cause a fluctuation in distance between chips. In addition, an excessively significant temperature difference dT may result in a problem that a semiconductor chip in the lower layer is not sufficiently heated so that a bump does not sufficiently melt, or an NCF is not sufficiently cured.

This problem can be ameliorated to some degree by heating a temporary laminate from below, that is, heating a stage on which a substrate is placed. However, in this case, laminates other than a laminate to be actually subjected to permanent crimping are also heated. At this time, when laminates other than a laminate to be actually subjected to permanent crimping are temporary laminates before being subjected to permanent crimping, there is concern of causing irreversible curing or the like of an NCF due to heat from the stage. In other words, heating a stage to a high temperature in order to reduce the temperature difference dT occurring during permanent crimping is not realistic.

An object of the present invention is to provide a mounting device, which can appropriately mount a plurality of semiconductor chips even if there are many layers to be laminated, and a method for manufacturing a semiconductor device.

Solution to Problem

According to an aspect of the present invention, there is provided a mounting device for laminating and mounting two or more semiconductor chips in a plurality of locations on a substrate. The mounting device includes a stage that supports the substrate; a bonding part that laminates and mounts a plurality of semiconductor chips on the substrate while heating the plurality of semiconductor chips and the substrate; and a heat insulating member that is interposed between the stage and the substrate and has a first layer which is in contact with the substrate and to which heat is applied from the bonding part via the semiconductor chips and the substrate, and a second layer which is disposed closer to the stage side than the first layer. The first layer has greater heat resistance than the second layer.

In a preferable aspect, the second layer may have higher rigidity than the first layer. In a preferable aspect, the first layer may have greater heat resistance in a surface direction than the second layer.

In a preferable aspect, the bonding part may repeat processing of collectively performing permanent crimping of the plurality of chips constituting a temporary laminate twice or more by heating the temporary laminate while crimping an upper surface of at least one temporary laminate after forming two or more temporary laminates in which the plurality of chips are laminated on the substrate while being subjected to temporary crimping.

In a preferable aspect, the first layer may include an organic substance or a workpiece in which a groove is formed on a surface on the substrate side or a plurality of pores are formed within the layer. The second layer may include a non-metal inorganic material. In this case, it is desirable that the first layer be a workpiece in which a latticed groove is formed on the surface on the substrate side at the same pitch as a disposition pitch of a chip laminate in which the plurality of chips are laminated.

According to another aspect of the present invention, there is provided a method for manufacturing a semiconductor device including a temporary crimping step of forming two or more temporary laminates in which a plurality of chips are laminated while being subjected to temporary crimping by a bonding part on a substrate disposed on a heat insulating member, and a permanent crimping step of repeating processing of collectively performing permanent crimping of the plurality of chips constituting the temporary laminate twice or more by heating the temporary laminate while the bonding part crimps an upper surface of at least one temporary laminate. The heat insulating member has a first layer which is in contact with the substrate and to which heat is applied from the bonding part via the semiconductor chips and the substrate, and a second layer which is disposed closer to the stage side than the first layer. The first layer has greater heat resistance than the second layer.

Advantageous Effects of Invention

According to the present invention, the heat insulating member is provided between the substrate and the stage. Moreover, the first layer of the heat insulating member in contact with the substrate has greater heat resistance than the second layer. Therefore, heat during permanent crimping is less likely to escape to the outside. As a result, it is possible to reduce the temperature difference between an upper layer and a lower layer of a chip laminate in which semiconductor chips are laminated, and it is possible to appropriately mount a plurality of semiconductor chips even if there are many layers to be laminated.

DESCRIPTION OF EMBODIMENT

Figure 1:
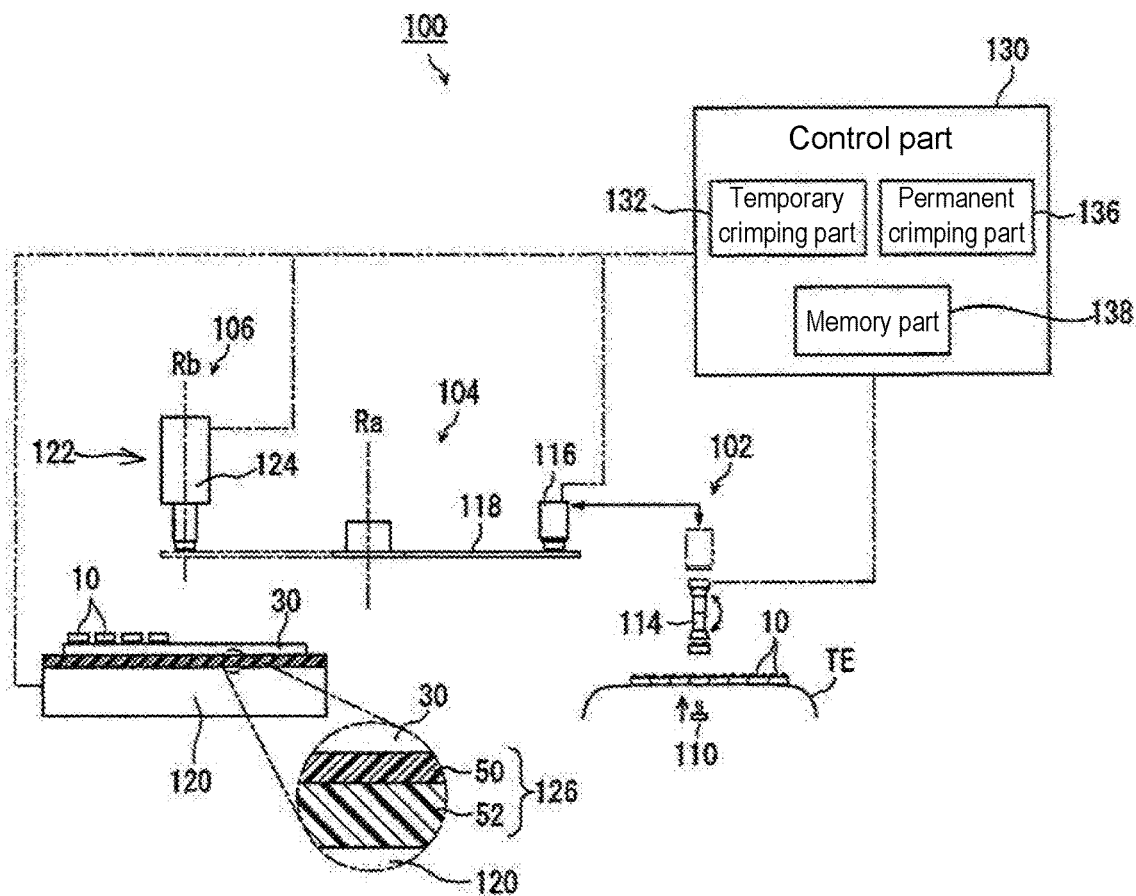
FIG. 1 is a schematic diagram of a configuration of a mounting device according to an embodiment of the present invention.

Hereinafter, an embodiment of the present invention will be described with reference to the drawings. FIG. 1 is a schematic diagram of a configuration of a mounting device 100 according to the embodiment of the present invention. This mounting device 100 is a device for mounting a semiconductor chip 10 on a substrate 30. This mounting device 100 has a configuration particularly preferable when laminating and mounting a plurality of semiconductor chips 10. In the following description, in laminates in which a plurality of semiconductor chips 10 are laminated, a laminate having a plurality of semiconductor chips 10 constituting the laminate in a state of temporary crimping will be referred to as "a temporary laminate STt", and a laminate having a plurality of semiconductor chips 10 in a state of permanent crimping will be referred to as "a chip laminate STc", thereby distinguishing them from each other.

The mounting device 100 includes a chip supplying part 102, a chip conveying part 104, a bonding part 106, and a control part 130 which controls driving of these. The chip supplying part 102 is a part which takes out the semiconductor chip 10 from a chip supplying source and supplies it to the chip conveying part 104. This chip supplying part 102 includes a push-up portion 110, a die picker 114, and a transfer head 116.

In the chip supplying part 102, a plurality of semiconductor chips 10 are placed on a dicing tape TE. At this time, the semiconductor chips 10 are placed in a face-up state in which bumps 18 are directed upward. The push-up portion 110 pushes up only one semiconductor chip 10 of these plurality of semiconductor chips 10 while maintaining the face-up state. The semiconductor chip 10 pushed up by the push-up portion 110 is subjected to suction-holding and is received by the die picker 114 at its lower end. The die picker 114 which has received the semiconductor chip 10 is rotated by 180 degrees on the spot, such that the bumps 18 of the semiconductor chip 10 are directed downward, that is, the semiconductor chip 10 is in a face-down state. In this state, the transfer head 116 receives the semiconductor chip 10 from the die picker 114.

The transfer head 116 can move in a vertical direction and a horizontal direction and can adsorb and hold the semiconductor chip 10 with its lower end. When the die picker 114 is rotated by 180 degrees and the semiconductor chip 10 is in a face-down state, the transfer head 116 adsorbs and holds the semiconductor chip 10 with its lower end. Thereafter, the transfer head 116 moves in the horizontal direction and the vertical direction to move to the chip conveying part 104.

The chip conveying part 104 has a rotary table 118 rotating about a vertical rotary axis Ra. The transfer head 116 places the semiconductor chip 10 at a predetermined position on the rotary table 118. When the rotary table 118 on which the semiconductor chip 10 is placed rotates about the rotary axis Ra, the semiconductor chip 10 is conveyed to the bonding part 106 positioned on a side opposite to the chip supplying part 102.

The bonding part 106 includes a stage 120 which supports the substrate 30, a bonding part 122 which attaches the semiconductor chip 10 to the substrate 30, and the like. The stage 120 can move in the horizontal direction and adjusts the relative positional relationship between the placed substrate 30 and a mount head 124. In addition, a heater is built into this stage 120 and heats the semiconductor chip 10 from below. In addition, in the present embodiment, a heat insulating member 126 is disposed between this stage 120 and the substrate 30. The configuration and operations of this heat insulating member 126 will be described below in detail.

The bonding part 122 is a device for laminating and mounting a plurality of semiconductor chips 10 on the substrate 30 and includes the mount head 124 and the like. The mount head 124 can hold the semiconductor chip 10 with its lower end. In addition, the mount head 124 can rotate around a vertical rotary axis Rb and can move upward and downward. This mount head 124 performs crimping of the semiconductor chip 10 on the substrate 30 or another semiconductor chip 10. Specifically, temporary crimping or permanent crimping of the semiconductor chip 10 is performed when the mount head 124 moves downward such that the held semiconductor chip 10 is pressed to the substrate 30 or the like. A temperature variable heater (not illustrated) is built into this mount head 124. The mount head 124 is heated to a first temperature T1 (which will be described below) when temporary crimping is executed and is heated to a second temperature T2 higher than the first temperature T1 when permanent crimping is executed. In addition, the mount head 124 applies a first load F1 to the semiconductor chip 10 when temporary crimping is executed and applies a second load F2 thereto when permanent crimping is executed.

A camera (not illustrated) is provided in the vicinity of the mount head 124. An alignment mark serving as a reference for positional alignment is indicated in each of the substrate 30 and the semiconductor chip 10. The camera captures images of the substrate 30 and the semiconductor chip 10 such that these alignment marks are identified. The control part 130 ascertains the relative positional relationship between the substrate 30 and the semiconductor chip 10 based on image data acquired by this image capturing. As necessary, the control part 130 adjusts the rotation angle of the mount head 124 around the rotary axis Rb and the horizontal position of the stage 120.

The control part 130 controls driving of each part and includes, for example, a CPU which performs various kinds of computation and a memory part 138 which stores various pieces of data and programs. The control part 130 functions as a temporary crimping part 132 or a permanent crimping part 136 by reading a program from the memory part 138. The temporary crimping part 132 forms a temporary laminate STt by driving the bonding part 122 and sequentially laminating two or more semiconductor chips while performing temporary crimping. The permanent crimping part 136 collectively performs permanent crimping of at least one semiconductor chip constituting each temporary laminate STt by driving the bonding part 122 and heating and crimping the upper surface of the formed temporary laminate STt.

The configuration of the mounting device 100 described herein is merely an example and may be suitably modified. For example, in the present embodiment, one mount head 124 performs both temporary crimping and permanent crimping. However, a mount head for temporary crimping and a mount head for permanent crimping may be provided. In addition, in the present embodiment, the stage 120 is configured to move horizontally. However, in place of or in addition to the stage 120, the mount head 124 may be configured to move horizontally. In addition, the configurations of the chip supplying part 102, the chip conveying part 104, and the like may also be suitably modified.

Figure 2:
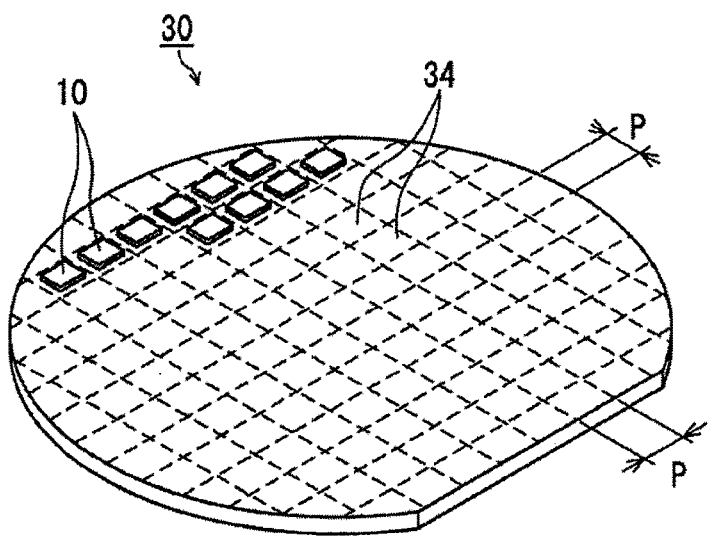
FIG. 2 is a schematic perspective view of a semiconductor wafer functioning as a substrate.

Next, a method for mounting the semiconductor chip 10 using this mounting device 100, that is, a method for manufacturing a semiconductor device will be described. In the present embodiment, a semiconductor wafer is used as the substrate 30, and a plurality of semiconductor chips 10 are laminated and mounted on this semiconductor wafer (substrate 30). Therefore, a mounting process of the present embodiment is "a chip-on-wafer process" in which the semiconductor chips 10 are laminated and mounted on a circuit forming surface of a semiconductor wafer. FIG. 2 is a schematic conceptual diagram of the substrate 30 (semiconductor wafer) used in the present embodiment. The substrate 30, which is a semiconductor wafer, mainly includes a silicon and has high heat conductivity compared to general circuit boards including a resin or a glass. In this case, the significant usefulness of the present embodiment is manifested, and effects which will be described below are similarly achieved in mounting with respect to a resin or a glass as well. As illustrated in FIG. 2, a plurality of disposition regions 34 arranged in a lattice shape are set on the substrate 30. A plurality of semiconductor chips 10 are laminated and mounted in each disposition region 34. The disposition regions 34 are arranged at a predetermined disposition pitch P. The value for this disposition pitch P is suitably set in accordance with the size or the like of the semiconductor chips 10 (mounting targets). In addition, in the present embodiment, the disposition region 34 has a substantially square shape. However, a different shape, for example, a substantially rectangular shape may be suitably adopted.

Figure 3:
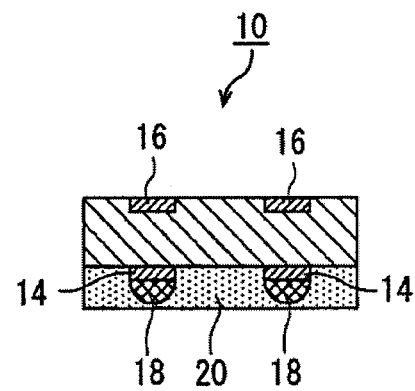
FIG. 3 is a view illustrating a configuration of a semiconductor chip to be mounted.

Next, the configuration of the semiconductor chip 10 will be simply described. FIG. 3 is a view illustrating a schematic configuration of the semiconductor chip 10 to be mounted. Electrode terminals 14 and 16 are formed on upper and lower surfaces of the semiconductor chip 10, respectively. In addition, the bumps 18 connected to the electrode terminals 14 are formed on one surface of the semiconductor chip 10. The bumps 18 include a conductive metal and melt at a predetermined melting temperature Tm.

In addition, a non-conductive film (which will hereinafter be referred to as "an NCF") 20 is stuck on one surface of the semiconductor chip 10 such that the bumps 18 are covered. The NCF 20 functions as an adhesive such that the semiconductor chip 10 and the substrate 30 or another semiconductor chip 10 adhere to each other. The NCF 20 includes a non-conductive thermosetting resin such as a polyimide resin, an epoxy resin, an acrylic resin, a phenoxy resin, and a polyether sulfone resin, for example. The thickness of this NCF 20 is larger than the average height of the bumps 18, and the bumps 18 are almost completely covered by this NCF 20. The NCF 20 is a solid film at a normal temperature. However, the NCF 20 is gradually softened in a reversible manner and fluidity is manifested when the temperature exceeds a predetermined softening start temperature Ts. The NCF 20 starts to be irreversibly cured when the temperature exceeds a predetermined curing start temperature Tt.

Here, the softening start temperature Ts is lower than the melting temperature Tm and the curing start temperature Tt of the bumps 18. The first temperature T1 for temporary crimping is higher than this softening start temperature Ts and is lower than the melting temperature Tm and the curing start temperature Tt. In addition, the second temperature T2 for permanent crimping is higher than the melting temperature Tm and the curing start temperature Tt. That is, Ts<T1<(Tm and Tt)<T2 is established.

When the semiconductor chip 10 is subjected to temporary crimping on the substrate 30 or another semiconductor chip 10 (which will hereinafter be referred to as "a crimping target") on the side below, the semiconductor chip 10 is crimped after the mount head 124 is heated to the first temperature T1. At this time, the NCF 20 of the semiconductor chip 10 is heated to a temperature near the first temperature T1 and is softened due to heat transfer from the mount head 124, thereby having fluidity. Then, accordingly, the NCF 20 flows into a gap between the semiconductor chip 10 and the crimping target and can reliably fill the gap.

When the semiconductor chip 10 is subjected to permanent crimping on a crimping target, the semiconductor chip 10 is crimped after the mount head 124 is heated to the second temperature T2. At this time, the bumps 18 and the NCF 20 of the semiconductor chip 10 are heated to a temperature near the second temperature T2 due to heat transfer from the mount head 124. Accordingly, the bumps 18 melt and can be welded to the facing crimping target. In addition, due to this heating, the NCF 20 is cured in a state of filling the gap between the semiconductor chip 10 and the crimping target. Therefore, the semiconductor chip 10 and the crimping target are firmly fixed to each other.

Figure 4:
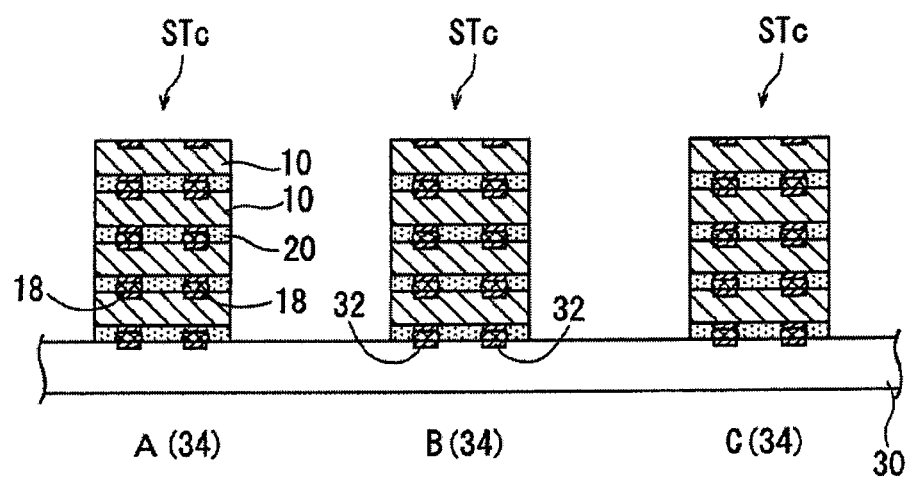
FIG. 4 is a view illustrating a configuration of a semiconductor device.

Next, a semiconductor device manufactured by laminating and mounting the semiconductor chips 10 will be described. FIG. 4 is a view illustrating a configuration of a semiconductor device in which a plurality of semiconductor chips 10 are laminated and mounted on the substrate 30. In the semiconductor device, the chip laminate STc in which as many of the semiconductor chips 10 are laminated and mounted as the target number of lamination layers is disposed in each of the plurality of disposition regions 34. In the present embodiment, the target number of lamination layers is set to "4", and the chip laminate STc constituted of four semiconductor chips 10 is mounted in one disposition region 34.

The temporary laminate STt is formed by sequentially laminating as many of the semiconductor chips 10 as the target number of lamination layers while performing temporary crimping. In addition, the chip laminate STc is formed by heating and crimping the temporary laminate STt from the upper surface and collectively performing permanent crimping of a plurality of semiconductor chips 10 constituting the temporary laminate STt. Here, regarding a method for forming a plurality of chip laminates STc, there is a method referred to as collective bonding. Collective bonding is a method of collectively performing permanent crimping of a plurality of semiconductor chips 10 constituting the temporary laminate STt by heating and crimping the upper surfaces of the temporary laminates STt in sequence after a plurality of temporary laminates STt are formed. According to this collective bonding, permanent crimping is continuously executed after temporary crimping is continuously executed. Therefore, compared to a method in which a next temporary laminate STt is formed after one chip laminate STc is completed (permanent crimping is finished), the number of times of switching the temperature of the mount head 124 can be drastically reduced. A standby time for a temperature rise or a temperature drop of the mount head 124 can be shortened by reducing the number of times of switching the temperature, and a processing time for the entire mounting processing can be reduced. Therefore, in the present embodiment as well, a plurality of chip laminates STc are formed by the collective bonding method.

Figure 5:
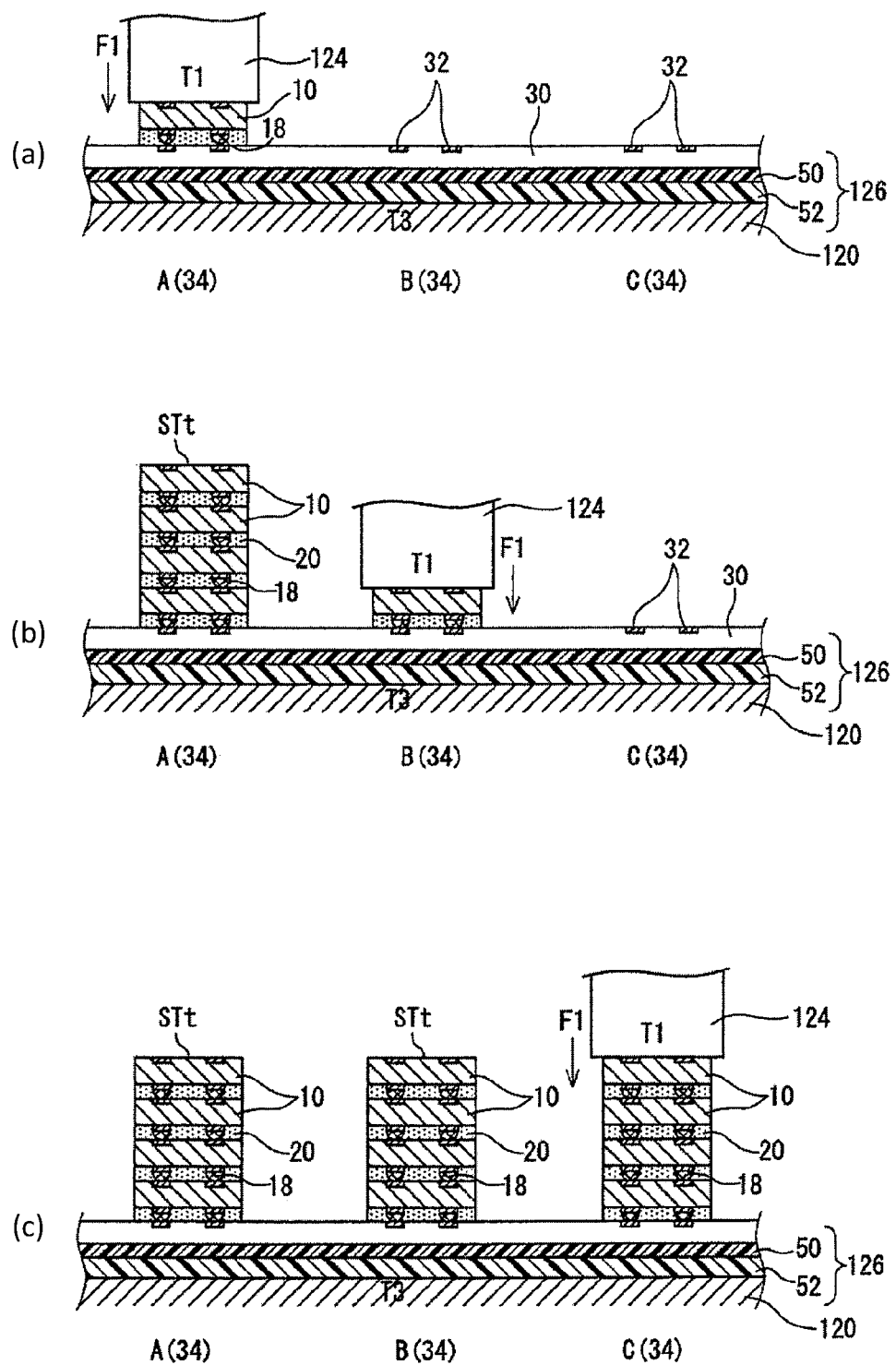
FIG. 5 is a view illustrating a flow of manufacturing a semiconductor device.
Figure 6:
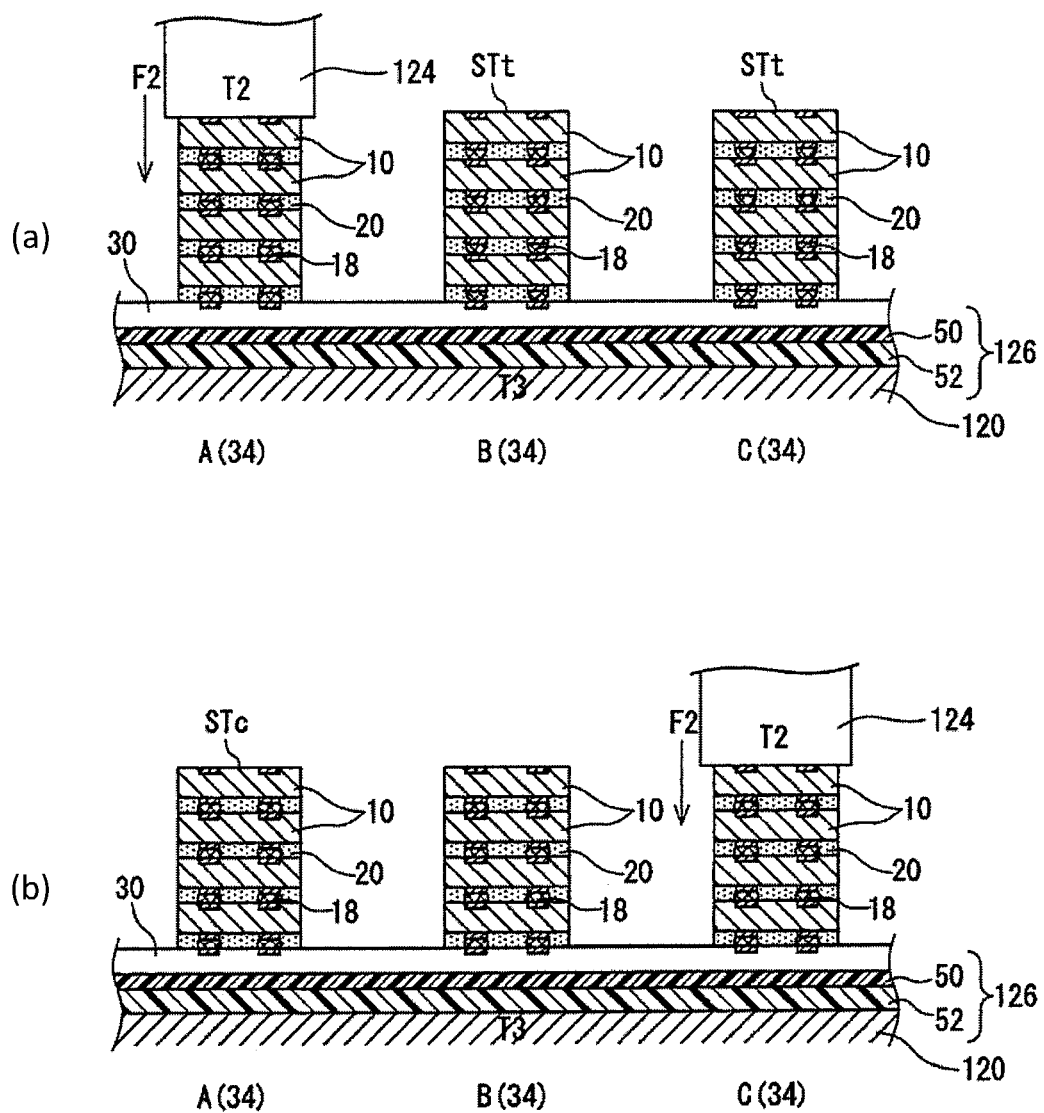
FIG. 6 is a view illustrating a flow of manufacturing a semiconductor device.

Hereinafter, a flow of manufacturing a semiconductor device in the present embodiment will be described. FIGS. 5 and 6 are conceptual diagrams illustrating a flow of manufacturing a semiconductor device. In FIGS. 5 and 6, three disposition regions 34 are illustrated. However, for the sake of convenience of description, these will be referred to as a region A, a region B, the region C in sequence from the left side. The manufacturing procedure described below may be performed under a normal pressure or may be performed in a vacuum state in order to prevent incorporation of air bubbles or the like.

In the present embodiment, in order to manufacture a plurality of chip laminates STc (semiconductor device), permanent crimping is performed by heating and crimping the upper surfaces of the temporary laminates STt in sequence after two or more temporary laminates STt are formed. Specifically, when a semiconductor device is manufactured, the stage 120 is continuously heated by the heater to a third temperature T3 lower than the curing start temperature Tt of the NCF 20 and the melting temperature Tm of the bumps 18. In this state, first of all, as illustrated in (a) of FIG. 5, the mount head 124 is used for disposing the semiconductor chip 10 in the region A on the substrate 30. At this time, the substrate 30 is positionally aligned with the semiconductor chip 10 such that the bumps 18 of the semiconductor chip 10 face electrode terminals 32 on the substrate 30. At this time, the mount head 124 is heated to the first temperature T1 which is a temperature for temporary crimping. Thereafter, the mount head 124 crimps the semiconductor chip 10 with the stipulated first load F1 and performs temporary crimping of the semiconductor chip 10 on the substrate 30. At this time, due to heat transfer from the mount head 124, the NCF 20 is heated to the softening start temperature Ts or higher such that adequate fluidity is manifested. Accordingly, the NCF 20 fills the clearance between the semiconductor chip 10 and the substrate 30 with no gap. The first load F1 is not particularly limited. The first load F1 need only have a magnitude to an extent at which the bumps 18 can be exposed from the softened NCF 20 and can come into contact with the electrode terminals 32 of the substrate 30 and the bumps 18 are not significantly deformed.

If the semiconductor chip 10 for a first layer can be subjected to temporary crimping, another semiconductor chip 10 for a second layer is subsequently subjected to temporary crimping on this semiconductor chip 10 in the first layer which has been subjected to temporary crimping. When the semiconductor chip 10 for the second layer is subjected to temporary crimping, similar to the case of the first layer, the mount head 124 is used for disposing the semiconductor chip 10 for the second layer on the semiconductor chip 10 in the first layer such that the bumps 18 of the semiconductor chip 10 in the second layer face the electrode terminals 16 of the semiconductor chip 10 in the first layer. Then, in this state, the semiconductor chip 10 in the second layer is crimped with the first load F1 while being heated to the first temperature T1 and is subjected to temporary crimping on the semiconductor chip 10 in the first layer.

Thereafter, similarly, another semiconductor chip 10 for a third layer is subjected to temporary crimping on the semiconductor chip 10 in the second layer, and another semiconductor chip 10 for a fourth layer is subjected to temporary crimping on the semiconductor chip 10 in the third layer. (b) of FIG. 5 illustrates a situation in which the semiconductor chip 10 in the fourth layer is laminated in the region A while being subjected to temporary crimping. A laminate in which these four semiconductor chips 10 are laminated becomes the temporary laminate STt.

If the temporary laminate STt can be formed in the region A, in a similar procedure, the temporary laminate STt is also formed in another disposition region 34. (c) of FIG. 5 illustrates a situation in which the temporary laminate STt is formed in all of the disposition regions 34 (the region A, the region B, and the region C).

If a plurality of temporary laminates STt can be formed, the formed temporary laminates STt are subsequently subjected to permanent crimping in sequence. Specifically, as illustrated in (a) of FIG. 6, first, the mount head 124 is heated to the second temperature T2 which is a temperature for permanent crimping. Then, the mount head 124 heated to the second temperature T2 is used for crimping the temporary laminate STt with the second load F2, and four semiconductor chips 10 are collectively subjected to permanent crimping. The second load F2 need only be able to appropriately retain the thrusting amount of the bumps 18 and is not particularly.

The four semiconductor chips 10 constituting the temporary laminate STt are also heated by being pressed by the mount head 124 heated to the second temperature T2. When each of the semiconductor chips 10 is heated to a temperature exceeding the curing start temperature Tt, the NCFs 20 of the semiconductor chips 10 are gradually cured. Then, due to the cured NCFs 20, the semiconductor chips 10 and the crimping targets (the substrate 30 or another semiconductor chip 10 on the side below) are mechanically and firmly fixed to each other. In addition, the bumps 18 melt by being heated to a temperature exceeding the melting temperature Tm and can tightly adhere to the facing electrode terminals 32 or 16. Then, accordingly, the chip laminate STc in which four semiconductor chips 10 and the substrate 30 are electrically joined to each other is formed.

If one temporary laminate STt can be subjected to permanent crimping, another temporary laminate STt is subsequently subjected to permanent crimping as well. That is, permanent crimping is executed in sequence in all of two or more disposition regions 34 such as the region B and the region C. Then, as illustrated in (b) of FIG. 6, if all of the formed temporary laminates STt can be subjected to permanent crimping, processing for manufacturing a semiconductor device ends.

As is obvious in the description above, the present embodiment adopts the collective bonding method in which the temporary laminates STt are subjected to permanent crimping in sequence after the temporary laminates STt are continuously formed in two or more disposition regions 34. Therefore, the number of times of switching the temperature of the mount head 124 can be reduced, the standby time for a temperature rise or a temperature drop can be reduced, and the time for the entire mounting processing can be drastically reduced.

Incidentally, as in the present embodiment, when it is intended that a plurality of laminated semiconductor chips 10 be collectively subjected to permanent crimping, a temperature difference dT between an upper layer and a lower layer becomes a problem. If this temperature difference dT is significant, there is concern that a fluctuation may occur in the distance between chips in layers. In addition, if the temperature difference dT is excessively significant so that the heating temperature of the lower layer falls, there is concern that curing of the NCFs 20 or melting of the bumps 18 may not progress appropriately and reliability of mounting may deteriorate. In the present embodiment, in order to reduce this temperature difference dT, the heat insulating member 126 is disposed between the stage 120 and the substrate 30.

The heat insulating member 126 has a two-layer structure including a first layer 50 in contact with the substrate 30, and a second layer 52 disposed closer to the stage 120 side than the first layer 50 (refer to FIG. 1). The first layer 50 is a layer which is adjacent to the substrate 30 and comes into contact with the substrate 30. The second layer 52 is a layer disposed closer to the stage 120 side than the first layer 50. Then, the first layer 50 has greater heat resistance than the second layer 52. In addition, generally, the stage 120 is also made of a material (for example, a ceramic) having relatively high heat resistance. However, it is desirable that the first layer 50 and the second layer 52 have greater heat resistance than this stage 120.

Regarding the specific configurations of the first layer 50 and the second layer 52, various configurations can be conceived. For example, the first layer 50 includes an organic substance such as a resin (for example, an epoxy resin or a polyimide resin) having a low heat resistance coefficient, and the second layer 52 includes a non-metal inorganic substance (quartz, a ceramic, or the like) having a low heat resistance coefficient. In addition, as another example, the first layer 50 may be a workpiece obtained by working an organic substance or a non-metal inorganic substance into a predetermined shape. The expression "working" is not limited to mechanical working in which a part of a material is removed using a milling cutter or the like and includes molding working such as plastic injection molding.

Figure 7:
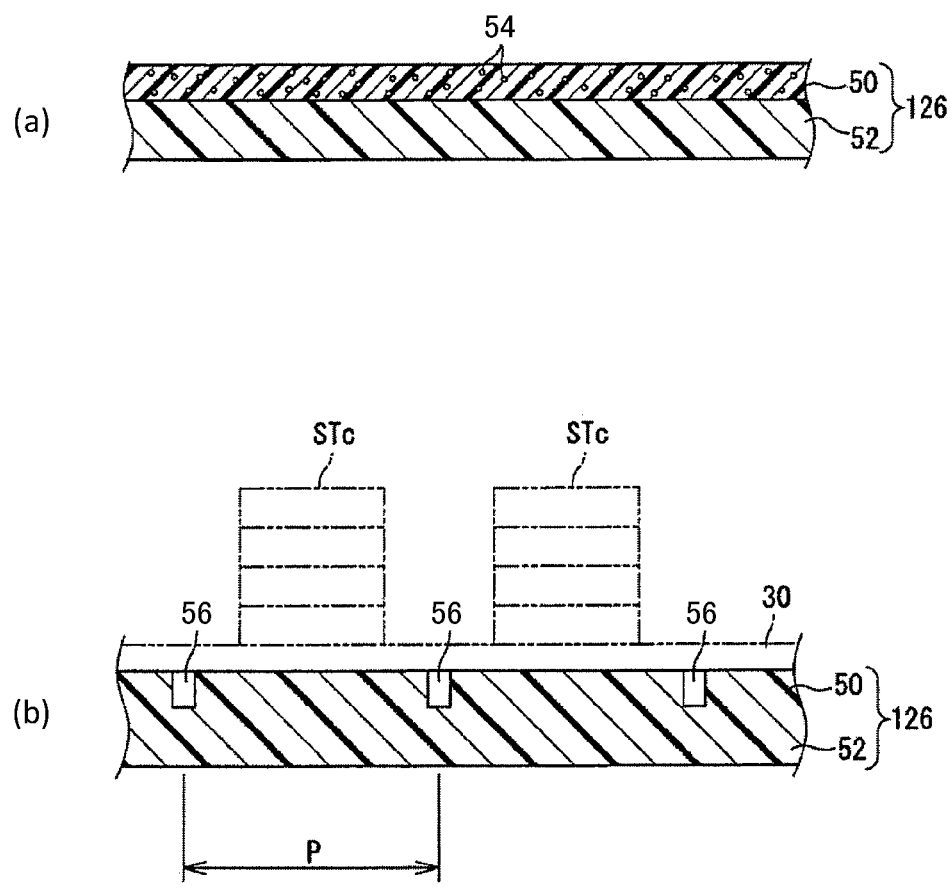
FIG. 7 is a view illustrating an example of a configuration of another heat insulating member.

As illustrated in (a) of FIG. 7, examples of a workpiece suitable for the first layer 50 include a workpiece in which a plurality of pores 54 are formed within the layer. In this case, the material of the first layer 50 may be any of an organic substance and an inorganic substance. However, in consideration of workability, it is desirable to adopt an organic substance such as a resin, or ceramic subjected to baking. In addition, as another example of a workpiece suitable for the first layer 50, as illustrated in (b) of FIG. 7, a workpiece in which a plurality of grooves 56 are formed on its surface may be adopted. In this case, the shapes of the grooves 56 are not particularly limited. However, it is desirable that the grooves 56 be arranged in a lattice shape at the same pitch P as the disposition pitch P of the chip laminates STc (refer to FIG. 2). The reason that this groove shape is desirable will be described below.

In addition, there is no need for the first layer 50 and the second layer 52 to be separate bodies, and they may be an integrated component which cannot be separated from each other. For example, as illustrated in (b) of FIG. 7, a plurality of grooves 56 may be formed on a surface of a flat plate, such that a thickness part in which these grooves 56 are formed serves as the first layer 50 and a thickness part in which no groove 56 is formed serves as the second layer 52.

In any case, the heat insulating member 126 need only have a multi-layer structure which has the first layer 50 in contact with the substrate 30 and the second layer 52 disposed closer to the stage 120 side than the first layer 50, and in which the first layer 50 has greater heat resistance than the second layer 52. Regarding heat resistance, there are surface direction heat resistance inhibiting heat transfer in a surface direction, and thickness direction heat resistance inhibiting heat transfer in a thickness direction. The surface direction heat resistance is particularly important for the first layer 50. For example, the surface direction heat resistance can be evaluated based on a stipulated distance from a heating place in the surface direction, the range of a temperature rise in a measurement place at a distance, or the like when surfaces of the layers 50 and 52 are heated under stipulated conditions. It is desirable that the first layer 50 have greater surface direction heat resistance than the second layer 52. In addition, as described below in detail, it is desirable that the second layer 52 have higher rigidity than the first layer 50, in order to maintain flatness of the substrate 30. Therefore, generally, the second layer 52 is constituted of a natural wood including a non-metal inorganic material.

Figure 8:
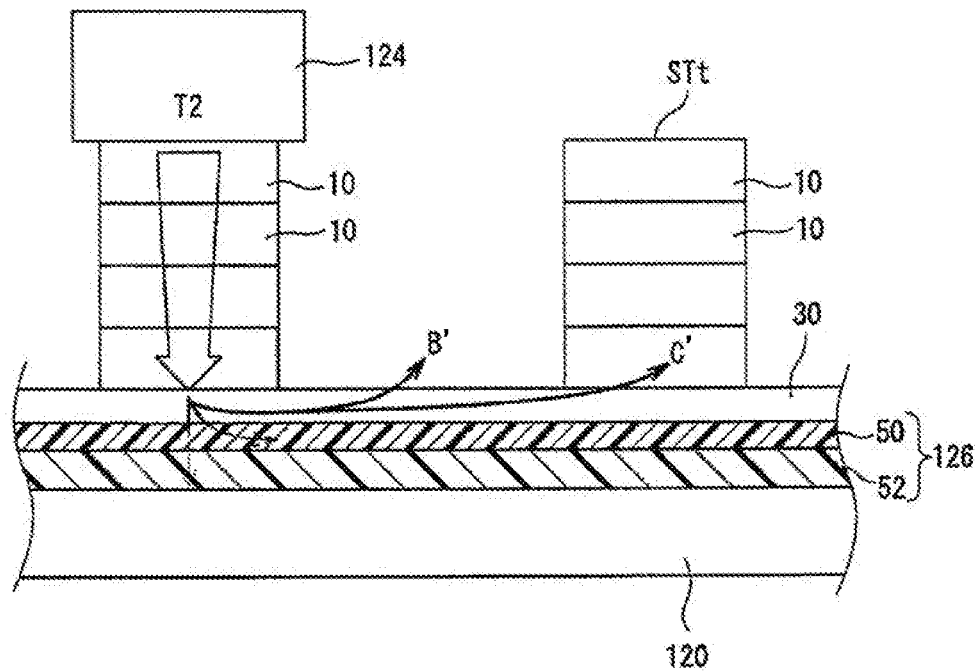
FIG. 8 is a conceptual diagram illustrating a flow of heat during permanent crimping.
Figure 9:
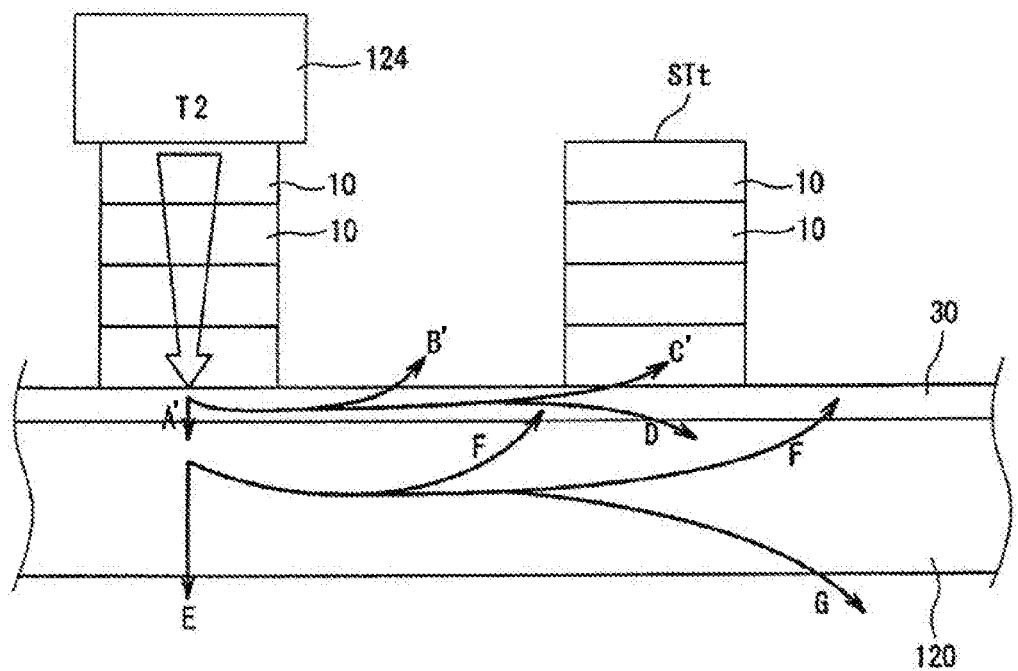
FIG. 9 is a conceptual diagram illustrating a flow of heat during permanent crimping in a configuration in the related art.

A reason for providing the heat insulating member 126 having a two-layer structure described above will be described with reference to FIGS. 8 and 9. FIGS. 8 and 9 are schematic views illustrating a flow of heat during permanent crimping. FIG. 8 illustrates a case in which the heat insulating member 126 is provided and FIG. 9 illustrates a case in which no heat insulating member 126 is provided, respectively.

First, with reference to FIG. 9, a flow of heat during permanent crimping will be described. As described already, during permanent crimping, the upper surface of the temporary laminate STt is pressed by the mount head 124 heated to the second temperature T2. At this time, due to heat transfer between the semiconductor chips 10, heat of the mount head 124 is transferred to the lower layer. Heat which has arrived at the semiconductor chip 10 in the lower layer does not stay on the spot but is further transferred to the substrate 30 or the stage 120.

Specifically, heat transferred to the substrate 30 intactly travels in a direction orthogonal to the plane and is transferred to the stage 120 (arrow A'), travels in the surface direction and is dissipated to the outside (arrow B'), is transferred to another temporary laminate STt (arrow C'), or is transferred to the stage 120 (arrow D). In addition, heat transferred to the stage 120 intactly travels in the surface direction and is dissipated to the outside (arrow E), travels in the surface direction and is transferred to the substrate 30 again (arrow F), or is dissipated to the outside (arrow G).

In this manner, when there is no heat insulating member 126, heat transferred to the lower layer escapes to the outside after further scattering in the substrate 30 or the stage 120. Therefore, the temperature of the semiconductor chip 10 in the lower layer is less likely to rise, so that the temperature difference dT between the upper layer and the lower layer increases. Particularly, when the substrate 30 is a wafer, since the wafer has higher heat transfer properties than a substrate made of a resin or a glass, the temperature difference dT increases.

This temperature difference dT can be reduced by raising the temperature of the stage 120. That is, since a heater is built into the stage 120, the temperature difference dT can be reduced by raising the heating temperature of this heater, for example, to the second temperature T2. However, when the stage 120 is heated to a high temperature, not only the temporary laminate STt which is a target for permanent crimping but also other temporary laminates STt (semiconductor chips 10 before being subjected to permanent crimping) are heated to a high temperature. In the example of FIG. 9, when the stage 120 is heated to a high temperature, not only the temporary laminate STt which is positioned on the left side in the diagram and is a target for permanent crimping but also the temporary laminate STt which is positioned on the right side in the diagram and is not a target is heated to a high temperature. As a result, there is concern of causing unintended irreversible curing of the NCFs 20 of the semiconductor chips 10 constituting the temporary laminates STt which are not targets. When the NCFs 20 are cured before permanent crimping, even if permanent crimping (heating and crimping) is performed thereafter, the semiconductor chips 10 are not appropriately connected to each other in an electrical and mechanical manner, thereby resulting in a mounting failure. Therefore, it has not been possible to increase the temperature of the stage 120 in order to reduce the temperature difference dT.

In the present embodiment, as illustrated in FIG. 8, the temperature of the stage 120 is retained substantially the same as (for example, near 100 degrees) that in technologies in the related art, and the heat insulating member 126 is provided between the stage 120 and the substrate 30. When this heat insulating member 126 is provided, heat dissipation via the substrate 30 and the stage 120 can be drastically reduced, and the temperature difference dT can also be reduced.

That is, as illustrated in FIG. 7, when the heat insulating member 126 is provided, the amount of heat transferred from the substrate 30 to its lower side is drastically reduced. In addition, since the first layer 50 has significant surface direction heat resistance, heat transferred to the first layer 50 scarcely scatters in the surface direction. As a result, flows (flows of the arrow F and the arrow G in FIG. 9) of heat which has further scattered in the substrate 30 or the stage 120 after scattering in the surface direction are almost eliminated, and escape of heat to the outside is effectively curbed. In addition, although a part of heat is also transferred from the first layer 50 to the second layer 52, since heat transfer is inhibited in the second layer 52 as well, heat transfer to the outside via the stage 120 is drastically curbed. As a result, heat dissipation to the outside or the substrate 30 via the stage 120 is drastically reduced. Then, accordingly, since a great part of heat stays in the lower layer of the temporary laminate STt, the temperature difference dT between the upper layer and the lower layer can be drastically reduced.

Incidentally, in the present embodiment, the heat insulating member 126 has a two-layer structure including the first layer 50 and the second layer 52, in order to curb scattering of heat (heat discharge) and retain mechanical strength. That is, it is desirable that the first layer 50 have significant surface direction heat resistance in order to curb scattering of heat. In order to increase the surface direction heat resistance, a material having a low heat transfer coefficient such as a resin may be used, or the grooves 56 or the pores 54 may be provided as illustrated in FIGS. 7(a) and 7(b). However, the rigidity of a material having a low heat transfer coefficient is often low. In addition, when the grooves 56 or the pores 54 are provided, the rigidity also deteriorates. Therefore, there is concern that a load applied during permanent crimping may not be bearable with only the first layer 50 having high surface direction heat resistance and flatness of the substrate 30 may not be able to be maintained.

Therefore, in the present embodiment, the second layer 52 having higher rigidity than the first layer 50 is provided below the first layer 50. Accordingly, even when a significant load is applied, warpage is less likely to occur, so that flatness of the substrate 30 can be maintained. In addition, when the second layer 52 is thicker than the first layer 50, heat transfer to the stage 120 can be more effectively prevented, and heat discharge via the stage 120 can be reduced.

In order to maintain flatness of the substrate 30, it is desirable that the first layer 50 itself be less likely to warp. In order to achieve this, it is desirable that a part of the heat insulating member 126 immediately below the chip laminate STc have a solid structure. Therefore, when the grooves 56 are provided on a surface of the first layer 50, as illustrated in (b) of FIG. 7, it is desirable that the grooves 56 be arranged in a lattice shape at the same pitch as the disposition pitch P of the chip laminate STc.

Figure 10:
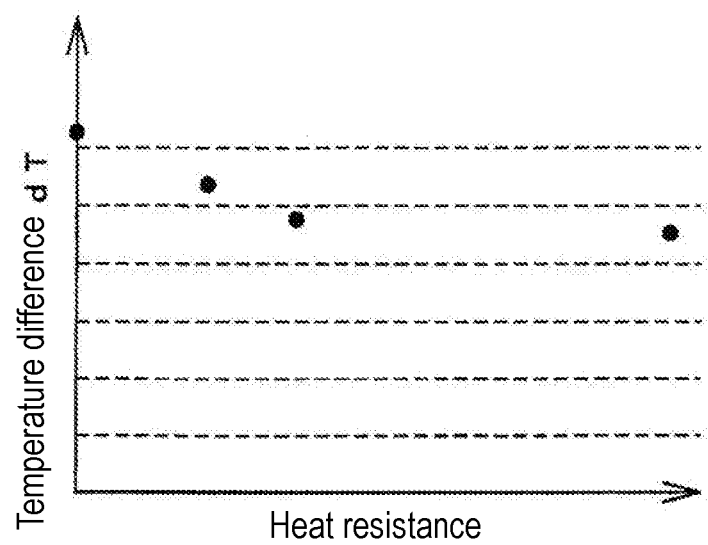
FIG. 10 is an experimental result showing a relationship between heat resistance of the heat insulating member and a temperature difference.

FIG. 10 is an experimental result of an investigation on a relationship between heat resistance of the heat insulating member 126 and the temperature difference dT. In FIG. 10, the horizontal axis indicates heat resistance of the heat insulating member 126, and the vertical axis indicates the temperature difference dT when the temporary laminate STt having a four-layer configuration is subjected to permanent crimping. In addition, in the experiment, the stage 120 was heated to a temperature near 100 degrees, and the upper surface of the temporary laminate STt was heated to 400 degrees for 7 seconds. For the sake of convenience of the experiment, the heat insulating member 126 had a single-layer structure, and its heat resistance was changed by changing the thickness of the heat insulating member 126. In addition, a silicon wafer was used as the substrate 30. As is obvious from FIG. 10, it was ascertained that the temperature difference dT decreased in accordance with a rise in heat resistance of the heat insulating member 126.

As is obvious from the description above, according to the present embodiment, since the heat insulating member 126 is interposed between the substrate 30 and the stage 120, heat can be effectively prevented from escaping to the outside during permanent crimping, and the temperature difference dT between the upper layer and the lower layer of the temporary laminate STt can be reduced. In addition, when the heat insulating member 126 has a multi-layer structure including the first layer 50 and the second layer 52, and when the heat resistance of the first layer 50 adjacent to the substrate 30 is increased, heat transferred from the substrate 30 can be more effectively prevented from escaping to the outside. Moreover, when the second layer 52 has higher rigidity than the first layer 50, escaping of heat can be curbed, and flatness of the substrate 30 can be maintained.

The configurations which have been described above are merely examples and may be suitably modified. For example, in the present embodiment, the temporary laminate STt is subjected to permanent crimping one at a time. However, two or more temporary laminates STt may be subjected to permanent crimping at the same time. In this case, a mount head 124b for permanent crimping is provided separately from a mount head 124a for temporary crimping, and the mount head 124b for permanent crimping has a size such that two or more temporary laminates STt can be heated and crimped at the same time. Due to such a configuration, the manufacturing time of a semiconductor device can be further shortened. In addition, the heat insulating member 126 need only have the first layer 50 and the second layer 52 and may have a multi-layer structure including another layer. In addition, it is desirable that the heat insulating member 126 be attachable and detachable with respect to the stage 120. However, in some cases, the heat insulating member 126 may be fixed to the stage 120.

The invention claimed is:

1. A mounting device for laminating and mounting a plurality of semiconductor chips in a plurality of locations on a substrate, the mounting device comprising:
   a stage that supports the substrate;
   a bonding part comprising a mount head with a temperature variable heater, wherein the mount head is configured to laminate and mount the plurality of semiconductor chips on the substrate while heating the plurality of semiconductor chips and the substrate; and
   a heat insulating member that is interposed between the stage and the substrate and has a first layer which is adjacent to the substrate and a second layer which is disposed closer to the stage side than the first layer, wherein the first layer has a greater heat resistance than the second layer.

2. The mounting device according to claim 1,
   wherein the second layer has a higher rigidity than the first layer.

3. The mounting device according to claim 1,
   wherein the first layer has a greater heat resistance along a surface direction than the second layer.

4. The mounting device according to claim 1,
   wherein the first layer comprises an organic substance or a workpiece in which a groove is formed on a surface on the substrate side or a plurality of pores are formed within the layer, and
   wherein the second layer comprises a non-metal inorganic material.

5. The mounting device according to claim 4,
   wherein the first layer is a workpiece in which a latticed groove is formed on the surface on the substrate side at a same pitch as a disposition pitch of a chip laminate in which the plurality of semiconductor chips are laminated.

6. A method for manufacturing a semiconductor device comprising:
   a temporary crimping step of forming a plurality of temporary laminates in which a plurality of semiconductor chips are laminated while being subjected to a temporary crimping by a bonding part on a substrate disposed on a heat insulating member, wherein the heat insulating member is interposed between the substrate and a stage supporting the substrate; and
   a permanent crimping step of repeating a process twice or more, the process comprising: collectively performing permanent crimping of the plurality of temporary laminates by heating the plurality of temporary laminates while the bonding part crimps an upper surface of at least one of the plurality of temporary laminates,
   wherein the heat insulating member has a first layer which is in contact with the substrate and to which heat is applied from the bonding part via the chips and the substrate, and a second layer which is disposed closer to the stage side than the first layer, and
   wherein the first layer has greater heat resistance than the second layer.

\* \* \* \* \*